United States Patent
Oh

(10) Patent No.: US 6,844,090 B2
(45) Date of Patent: Jan. 18, 2005

(54) ORGANIC ELECTROLUMINESCENT DEVICE

(75) Inventor: Hyoung Yun Oh, Seoul (KR)

(73) Assignee: LG Electronics Inc., Seoul (KR)

(*) Notice: Subject to any disclaimer, the term of this patent is extended or adjusted under 35 U.S.C. 154(b) by 0 days.

(21) Appl. No.: 10/233,434

(22) Filed: Sep. 4, 2002

(65) Prior Publication Data

US 2003/0054199 A1 Mar. 20, 2003

(30) Foreign Application Priority Data

Sep. 6, 2001 (KR) ........................ P2001-54789

(51) Int. Cl.$^7$ ................. B32B 19/00; B32B 9/00; H01J 1/62; H01J 63/04; C09K 11/06; H01L 35/24; H01L 29/34; H05B 33/14
(52) U.S. Cl. ................ 428/690; 428/917; 313/504; 313/506; 257/40; 257/102; 257/103; 252/301.16
(58) Field of Search ................. 428/690, 917; 313/504, 506; 257/40, 102, 103; 252/301.16

(56) References Cited

U.S. PATENT DOCUMENTS

| | | | |
|---|---|---|---|
| 5,359,887 A | 11/1994 | Schwab et al. | 73/147 |
| 6,097,147 A * | 8/2000 | Baldo et al. | 313/506 |
| 6,114,805 A * | 9/2000 | Codama et al. | 313/509 |
| 6,262,433 B1 * | 7/2001 | Arai et al. | 257/40 |
| 6,322,910 B1 * | 11/2001 | Arai et al. | 428/690 |
| 6,339,290 B1 * | 1/2002 | Nakaya | 313/506 |
| 6,372,154 B1 * | 4/2002 | Li | 252/301.16 |
| 6,579,632 B2 * | 6/2003 | Thompson et al. | 428/690 |

FOREIGN PATENT DOCUMENTS

| | | |
|---|---|---|
| JP | 5-105872 | 10/1991 |
| JP | 11-339965 | 5/1998 |
| JP | 2000-252071 | 9/2000 |
| WO | 00/40668 | 7/2000 |

* cited by examiner

*Primary Examiner*—Cynthia H. Kelly
*Assistant Examiner*—Camie Thompson
(74) *Attorney, Agent, or Firm*—Fleshner & Kim, LLP

(57) ABSTRACT

An organic electroluminescent device is disclosed, which can obtain high luminance and high efficiency. The organic electroluminescent device includes a luminescent layer formed by doping a phosphor material on a host material expressed by the following chemical formula:

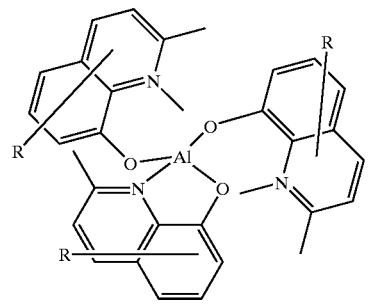

where R is any one selected from a group consisting of H, an alkyl group, an allyl group, and halogen.

14 Claims, 2 Drawing Sheets

ORGANIC ELECTROLUMINESCENT DEVICE

This application claims the benefit of the Korean Application No. P2001-54789 filed on Sep. 6, 2001, which is hereby incorporated by reference.

BACKGROUND OF THE INVENTION

1. Field of the Invention

The present invention relates to an organic electroluminescent device (OELD), and more particularly, to an organic electroluminescent device that uses a phosphorescent material as a luminescent material.

2. Discussion of the Related Art

Recently, with the trend of a large sized display, a request of a flat display that occupies a small area has been increased. One example of the flat display is an electroluminescent device. The electroluminescent device is divided into an inorganic electroluminescent device and an organic electroluminescent device.

The inorganic electroluminescent device is commercially used and emits light in such a way that electrons are accelerated by applying high electric field to a luminescent portion and the accelerated electrons collide against the center of the luminescent portion to excite the center of the luminescent portion. The inorganic electroluminescent device has drawbacks in that power consumption is high and it is difficult to obtain high luminance and various luminescent colors.

On the other hand, the organic electroluminescent device has a sandwich structure in which a thin film shaped organic luminescent material having semiconductor characteristics exists between an anode and a cathode. The organic electroluminescent device emits light such as phosphor or fluorescence as excitons are transited from an excited state to a ground state. The excitons are produced by injecting electrons from the cathode and electron holes from the anode into the organic luminescent material if a direct current is applied to the cathode and the anode and by combining the injected electrons and the electron holes with each other. The organic electroluminescent device has high response time and is driven by a direct current voltage of several volts to several tens of volts. Also, the organic electroluminescent device can obtain high luminance of several hundreds to thousands of $cd/m^2$ and various luminescent colors depending on the change of a molecular structure.

For commercial use of the organic electroluminescent device, it is necessary to improve efficiency of the luminescent device and enable full color display. To this end, the related art organic electroluminescent device has a multi-layered structure. That is, the related art organic electroluminescent device includes a material layer having electron injection (transport) and electron hole injection (transport) characteristics in addition to a luminescent layer formed between a cathode and an anode. The material layer serves to control injection quantity and mobility of the electrons and the electron holes, thereby obtaining high efficiency.

However, the related art organic electroluminescent device having a multi-layered structure as above has a problem in that it is not sufficient for display due to insufficiency in luminescent efficiency and lifetime of the device. Accordingly, to obtain an electroluminescent device having high luminance and high efficiency, development of the device is required in both a structural aspect such as adding a new layer and a material aspect such as developing a material having excellent luminescent efficiency or excellent injection and transport characteristics of the electron holes (or electrons).

SUMMARY OF THE INVENTION

Accordingly, the present invention is directed to an organic electroluminescent device that substantially obviates one or more problems due to limitations and disadvantages of the related art.

An object of the present invention is to provide an organic electroluminescent device that can obtain high luminance and high efficiency using a phosphor material having excellent luminescent characteristics.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic electroluminescent device having a layered structure in which an anode, an organic layer, and a cathode are sequentially formed on a substrate is characterized in that the organic layer includes a luminescent layer formed by doping a phosphor material on a host material expressed by the following chemical formula:

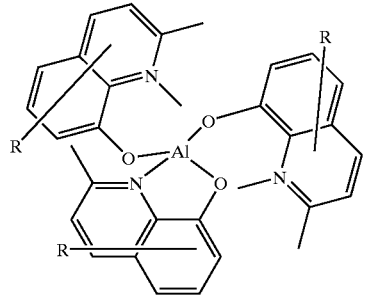

where R is any one selected from a group consisting of H, an alkyl group, an aryl group, and halogen.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Light formed in an organic electroluminescent device can be divided into fluorescence generated from a singlet state and phosphor generated from a triplet state. Theoretically, the fluorescence has a luminescent efficiency of 25% while the phosphor has a luminescent efficiency of 75%. In a fluorescent element, excitons of 75% are all extinguished so as not to emit light. On the other hand, since triplet excitons can be used in case of a phosphor element, luminescent efficiency can be improved.

Therefore, in the present invention, a luminescent layer is formed by doping a phosphor material on a host material.

First Embodiment

Figure 1:
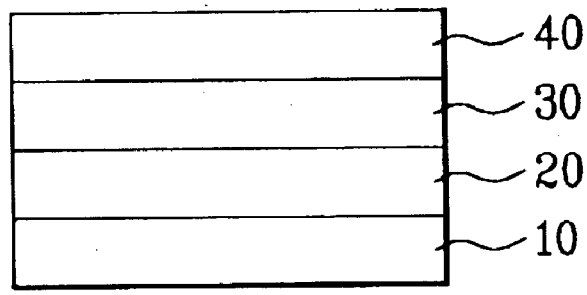
FIG. 1 is a sectional view illustrating an organic electroluminescent device according to the first embodiment of the present invention.

FIG. 1 is a sectional view illustrating an organic electroluminescent device according to the first embodiment of the present invention. Referring to FIG. 1, the organic electroluminescent device according to the first embodiment of the present invention has a layered structure in which an anode 20, an organic layer 30, and a cathode 40 are sequentially formed on a substrate 10.

The substrate 10 is formed of a transparent material, and the anode 20 is formed of ITO ($In_2O_3+SnO_3$) or IZO ($In_2O_3+ZnO$) by sputtering. The cathode 40 is formed of Mg/Ag, Al, Li/Al, LiF/Al, LiO2/Al etc.

The organic layer 30 includes a luminescent layer formed by doping a phosphor material on a host material expressed by the following chemical formula.

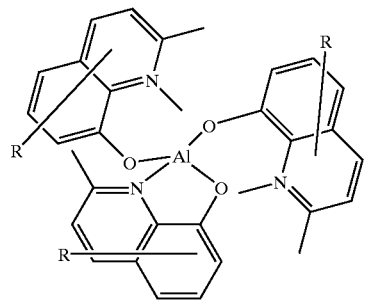

The host material expressed by the above chemical formula is designated as $Almq_3$.

In the above chemical formula, R is any one material selected from a group consisting of hydrogen(H), alkyl group, aryl group, and halogen.

Preferably, the alkyl group has a carbon number within the range of 1 to 20 ($C_{1-20}$). It is preferable that the allyl group is any one material selected from a group consisting of benzene, naphthalene, anthracene, and phenanthrene. It is preferable that the halogen is any one material selected from a group consisting of fluorine(F), chlorine(Cl), and bromine (Br).

More preferably, the host material is formed by the following chemical formula.

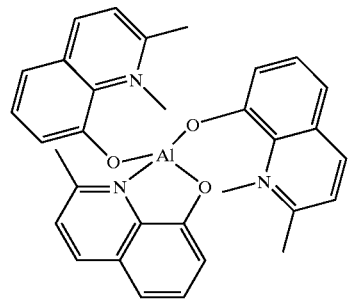

Second Embodiment

Figure 2:
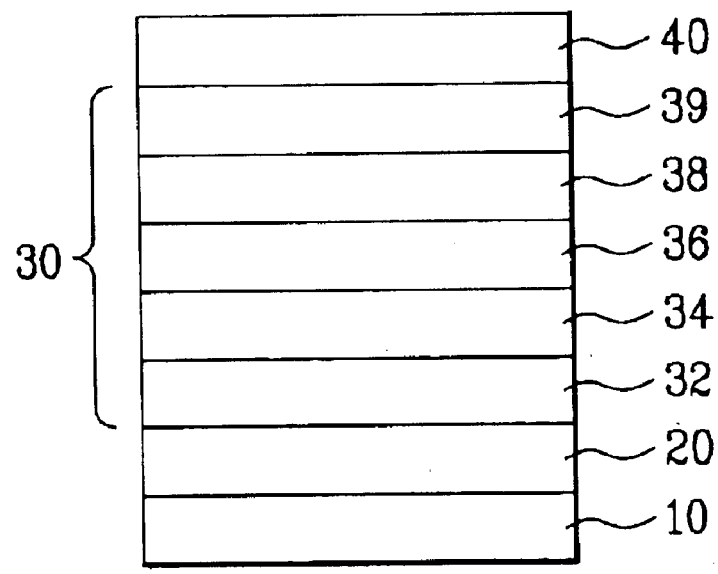
FIG. 2 is a sectional view illustrating an organic electroluminescent device according to the second embodiment of the present invention.

FIG. 2 is a sectional view illustrating an organic electroluminescent device according to the second embodiment of the present invention. Referring to FIG. 2, the organic electroluminescent device according to the second embodiment of the present invention has a layered structure in which an anode 20, an organic layer 30, and a cathode 40 are sequentially formed.

The organic layer 30 includes a hole injection layer 32, a hole transport layer 34, a luminescent layer 36, an electron transport layer 38 and an electron injection layer 39.

The luminescent layer 36 is formed by doping a phosphor material on a host material expressed by the following chemical formula.

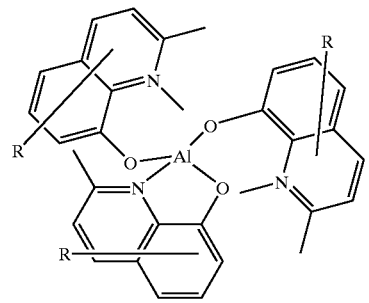

In the above chemical formula, R is any one material selected from a group consisting of H, alkyl group, aryl group, and halogen.

Preferably, the alkyl group has a carbon number within the range of 1 to 20. It is preferable that the aryl group is any one material selected from a group consisting of benzene, naphthalene, anthracene, and phenanthrene. It is preferable that the halogen is any one material selected from a group consisting of F, Cl, and Br.

More preferably, the host material is formed by the following chemical formula.

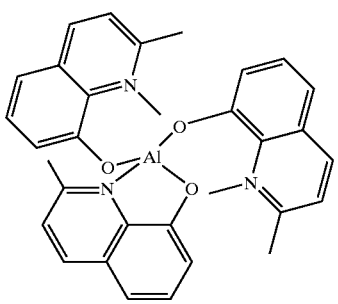

The anode 20 and the cathode 40 are formed of the same material as that of the first embodiment The hole injection layer 32 may be formed by depositing copper(II)Phthalocyanine (CuPC) on the anode 20 under the vacuum state. The hole transport layer 34 may be formed by depositing triphenyl amine derivatives, such as N,N-di (naphthalene-1-yl)-N,N'-diphenylbenzidine, on the hole injection layer 32 under the vacuum state.

The electron transport layer 38 may be formed by depositing oxadiazol and triazol derivatives, such as Alq3 or 2-(4-biphenyl)-5-(4-tert-butylphenyl)-1,3,4-oxidiazol, on the luminescent layer 36 under the vacuum state.

The electron injection layer 39 may be formed by depositing derivatives (e.g., $Li_2O$) based on alkali metals (Cs, LiF, K, Na, and Li) on the electron transport layer 38 under the vacuum state.

Figure 3:
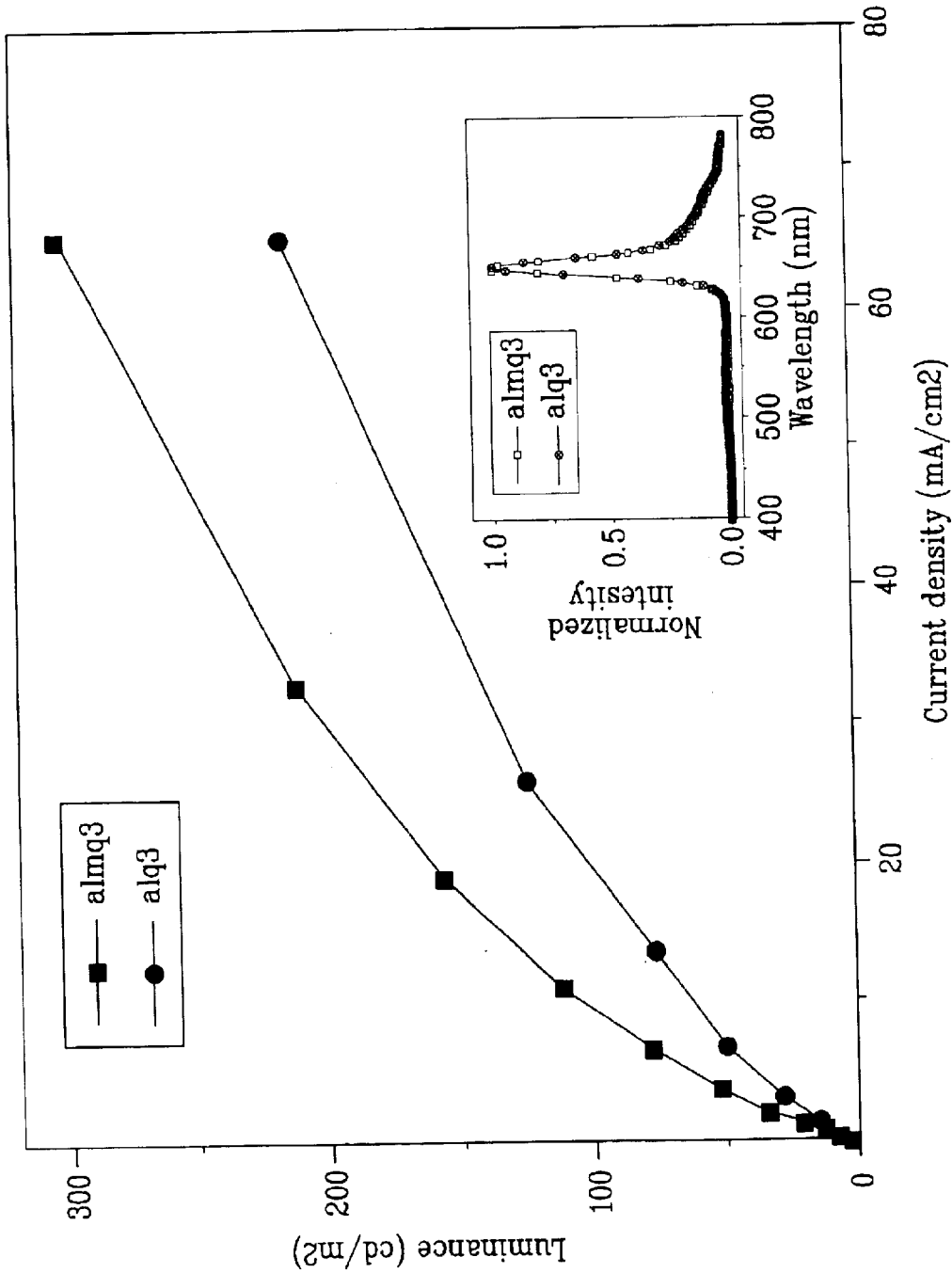
FIG. 3 is a graph illustrating the result of an experiment for comparing luminescent efficiency of an organic electroluminescent device of the present invention with that of a related art organic electroluminescent device.

The result of FIG. 3 has been obtained by comparing luminescent efficiency of the organic electroluminescent device according to the present invention with the related art organic electroluminescent device through the third embodiment and experimental example.

Third Embodiment

A hole injection layer is formed at a thickness of 6 nm by depositing CuPC on ITO glass under the vacuum state. A hole transport layer is formed at a thickness of 35 nm by depositing 4,4'-bis[N-(1-naphthyl)-N-phenylamino]-biphenyl (NPD) on the hole injection layer under the vacuum state. A luminescent layer is formed at a thickness of 40 nm by depositing 2,3,7,8,12,13,17,18-octaethyl-21H, 23H-porphin platinum(II) (PtOEP) (6%) having the following chemical formula on the hole transport layer under the vacuum state.

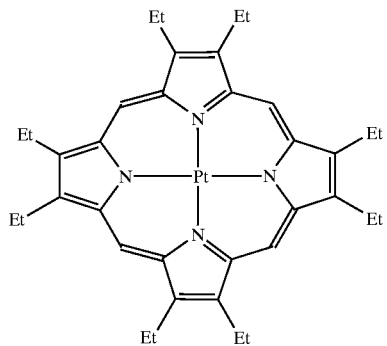

At this time, $Almq_3$ is used as a host. Then, an electron transport layer (k is formed at a thickness of 10 nm by depositing $Alq_3$ on the luminescent layer under the vacuum state. A cathode is finally formed on the electron transport layer. As a result, the organic electroluminescent device is completed.

EXPERIMENTAL EXAMPLE

In the experimental example, the organic electroluminescent device is manufactured in the same manner as the third embodiment except that a host material having the following chemical formula ($Alq_3$) is used as a luminescent layer and PtOEP(6%) is used as a dopant.

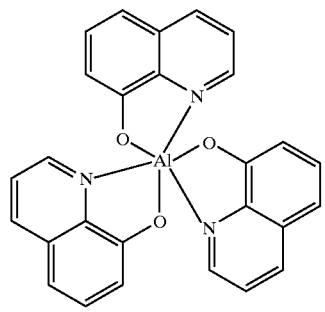

As a result that a voltage is applied to the organic electroluminescent device manufactured in the third embodiment and the experimental example, as will be apparent from FIG. 3, it is noted that the following results are obtained. If $Almq_3$ of the present invention is used as a host material of the luminescent layer, it is noted that the red color is obtained in the same manner as the related art. It is also noted that the luminescent efficiency is improved 1.5 to 2 times.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A red electroluminescent device having a layered structure in which an anode, an organic layer, and a cathode are sequentially formed on a substrate, wherein the organic layer includes a luminescent layer formed by doping a phosphor material on a host material, $Almq_3$, expressed by the following chemical formula:

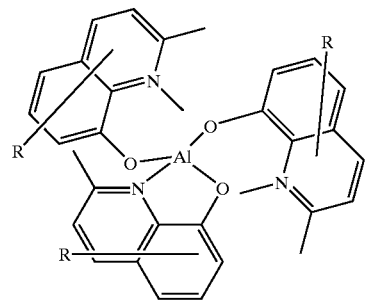

where R is selected from the group consisting of hydrogen, an alkyl group, an aryl group, and a halogen, wherein the phosphor material is PtOEP.

2. The red electroluminescent device of claim 1, wherein R is an alkyl group having a carbon number within the range of 1 to 20 ($C_{1-20}$).

3. The red electroluminescent device of claim 1, wherein R is an aryl group selected from group consisting of benzene, naphthalene, anthracene, and phenanthrene.

4. The red electroluminescent device of claim 1, wherein R is a halogen selected from the group consisting of fluorine, chlorine, and bromine.

5. The red electroluminescent device of claim 1, wherein R is hydrogen.

6. The red electroluminescent device of claim 1, wherein the hole injection layer is formed of copper(II) phthalocyanine (CuPC).

7. A red electroluminescent device having a layered structure in which an anode, an organic layer, and a cathode are sequentially layered on a substrate, wherein the organic layer is formed by sequentially depositing a hole injection layer, a hole transport layer, a luminescent layer, an electron transport layer, and an electron injection layer and wherein the luminescent layer is formed by doping a phosphor material on a host material, $Almq_3$, expressed by the following chemical formula:

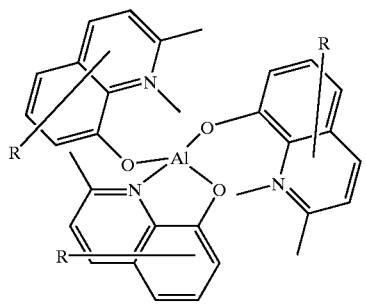

where R is selected from the group consisting of hydrogen, an alkyl group, an aryl group, and a halogen, wherein the phosphor material is PtOEP.

8. The red electroluminescent device of claim 7, wherein R is an alkyl group having a carbon number within the range of 1 to 20.

9. The red electroluminescent device of claim 7, wherein R is an aryl group selected from the group consisting of benzene, naphthalene, anthracene, and phenanthrene.

10. The red electroluminescent device of claim 7, wherein R is a halogen selected from the group consisting of fluorine, chlorine, and bromine.

11. The red electroluminescent device of claim 7, wherein R is hydrogen.

12. The red electroluminescent device of claim 7, wherein the hole transport layer is formed of triphenyl amine derivatives.

13. The red electroluminescent device of claim 7, wherein the electron transport layer is formed of $Alq_3$.

14. The red electroluminescent device of claim 7, wherein the electron injection layer is formed of alkali metal derivatives.

* * * * *